(12) United States Patent
Chan et al.

(10) Patent No.: US 8,305,829 B2
(45) Date of Patent: Nov. 6, 2012

(54) MEMORY POWER GATING CIRCUIT FOR CONTROLLING INTERNAL VOLTAGE OF A MEMORY ARRAY, SYSTEM AND METHOD FOR CONTROLLING THE SAME

(75) Inventors: Wei Min Chan, Sindian (TW); Jack Liu, Taipei (TW); Shao-Yu Chou, Chu Pei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 322 days.

(21) Appl. No.: 12/707,788

(22) Filed: Feb. 18, 2010

(65) Prior Publication Data

US 2010/0214863 A1 Aug. 26, 2010

Related U.S. Application Data

(60) Provisional application No. 61/154,744, filed on Feb. 23, 2009.

(51) Int. Cl.
*G11C 7/00* (2006.01)

(52) U.S. Cl. .............. 365/228; 365/189.07; 365/189.09; 327/538; 327/4; 327/540; 327/536

(58) Field of Classification Search .................. 365/228, 365/189.07, 189.09; 327/538, 4, 540, 536
See application file for complete search history.

(56) References Cited

U.S. PATENT DOCUMENTS

| | | | |
|---|---|---|---|
| 5,581,202 A | 12/1996 | Yano et al. | |
| 5,658,417 A | 8/1997 | Watanabe et al. | |
| 5,767,732 A | 6/1998 | Lee et al. | |
| 5,963,789 A | 10/1999 | Tsuchiaki | |
| 6,065,481 A | 5/2000 | Fayfield et al. | |
| 6,121,786 A * | 9/2000 | Yamagami et al. | ........ 324/750.3 |
| 6,299,724 B1 | 10/2001 | Fayfield et al. | |
| 6,503,794 B1 | 1/2003 | Watanabe et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |
| 6,727,557 B2 | 4/2004 | Takao | |

(Continued)

FOREIGN PATENT DOCUMENTS

CN 101179046 5/2005

(Continued)

OTHER PUBLICATIONS

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

(Continued)

*Primary Examiner* — Connie Yoha
(74) *Attorney, Agent, or Firm* — Lowe Hauptman Ham & Berner, LLP

(57) ABSTRACT

A power gating circuit configured to couple with a memory array having an internal voltage, wherein the power gating circuit includes circuitry having an output signal that raises the internal voltage of the memory array if the internal voltage is lower than a first threshold voltage, and lowers the internal voltage if the internal voltage is higher than a second threshold voltage, thereby retaining the internal voltage between the first threshold voltage and the second threshold voltage.

24 Claims, 9 Drawing Sheets

U.S. PATENT DOCUMENTS

| | | |
|---|---|---|
| 6,740,247 B1 | 5/2004 | Han et al. |
| 6,743,673 B2 | 6/2004 | Watanabe et al. |
| 6,762,448 B1 | 7/2004 | Lin et al. |
| 6,828,646 B2 | 12/2004 | Marty et al. |
| 6,830,994 B2 | 12/2004 | Mitsuki et al. |
| 6,858,478 B2 | 2/2005 | Chau et al. |
| 6,872,647 B1 | 3/2005 | Yu et al. |
| 6,940,747 B1 | 9/2005 | Sharma et al. |
| 6,949,768 B1 | 9/2005 | Anderson et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,084,079 B2 | 8/2006 | Conti et al. |
| 7,084,506 B2 | 8/2006 | Takao |
| 7,112,495 B2 | 9/2006 | Ko et al. |
| 7,153,744 B2 | 12/2006 | Chen et al. |
| 7,157,351 B2 | 1/2007 | Cheng et al. |
| 7,190,050 B2 | 3/2007 | King et al. |
| 7,193,399 B2 * | 3/2007 | Aikawa .................... 323/282 |
| 7,247,887 B2 | 7/2007 | King et al. |
| 7,265,008 B2 | 9/2007 | King et al. |
| 7,265,418 B2 | 9/2007 | Yun et al. |
| 7,298,600 B2 | 11/2007 | Takikawa et al. |
| 7,300,837 B2 | 11/2007 | Chen et al. |
| 7,315,994 B2 | 1/2008 | Aller et al. |
| 7,323,375 B2 | 1/2008 | Yoon et al. |
| 7,338,614 B2 | 3/2008 | Martin et al. |
| 7,351,622 B2 | 4/2008 | Buh et al. |
| 7,358,166 B2 | 4/2008 | Agnello et al. |
| 7,361,563 B2 | 4/2008 | Shin et al. |
| 7,374,986 B2 | 5/2008 | Kim et al. |
| 7,394,116 B2 | 7/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,967 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,550,332 B2 | 6/2009 | Yang |
| 7,598,145 B2 | 10/2009 | Damlencourt et al. |
| 7,605,449 B2 | 10/2009 | Liu et al. |
| 7,685,911 B2 | 3/2010 | Wu |
| 7,759,228 B2 | 7/2010 | Sugiyama et al. |
| 7,798,332 B1 | 9/2010 | Brunet |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,923,339 B2 | 4/2011 | Meunier-Beillard et al. |
| 7,960,791 B2 * | 6/2011 | Anderson et al. ............ 257/349 |
| 7,985,633 B2 | 7/2011 | Cai et al. |
| 7,989,846 B2 | 8/2011 | Furuta |
| 7,989,855 B2 | 8/2011 | Narihiro |
| 8,003,466 B2 | 8/2011 | Shi et al. |
| 8,043,920 B2 | 10/2011 | Chan et al. |
| 8,076,189 B2 | 12/2011 | Grant |
| 8,101,475 B2 | 1/2012 | Oh et al. |
| 2003/0080361 A1 | 5/2003 | Murthy et al. |
| 2003/0234422 A1 | 12/2003 | Wang et al. |
| 2004/0192067 A1 | 9/2004 | Ghyselen et al. |
| 2004/0259315 A1 | 12/2004 | Sakaguchi et al. |
| 2005/0020020 A1 | 1/2005 | Collaert et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212080 A1 | 9/2005 | Wu et al. |
| 2005/0221591 A1 | 10/2005 | Bedell et al. |
| 2005/0224800 A1 | 10/2005 | Lindert et al. |
| 2005/0266698 A1 | 12/2005 | Cooney et al. |
| 2005/0280102 A1 | 12/2005 | Oh et al. |
| 2006/0038230 A1 | 2/2006 | Ueno et al. |
| 2006/0068553 A1 | 3/2006 | Thean et al. |
| 2006/0091937 A1 * | 5/2006 | Do .................... 327/538 |
| 2006/0105557 A1 | 5/2006 | Klee et al. |
| 2006/0128071 A1 | 6/2006 | Rankin et al. |
| 2006/0138572 A1 | 6/2006 | Arikado et al. |
| 2006/0151808 A1 | 7/2006 | Chen et al. |
| 2006/0166475 A1 | 7/2006 | Mantl |
| 2006/0214212 A1 | 9/2006 | Horita et al. |
| 2006/0258156 A1 | 11/2006 | Kittl |
| 2007/0001173 A1 | 1/2007 | Brask et al. |
| 2007/0015334 A1 | 1/2007 | Kittl et al. |
| 2007/0020827 A1 | 1/2007 | Buh et al. |
| 2007/0024349 A1 * | 2/2007 | Tsukude ................ 327/540 |
| 2007/0029576 A1 | 2/2007 | Nowak et al. |
| 2007/0048907 A1 | 3/2007 | Lee et al. |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 * | 10/2007 | Hur et al. .................. 327/536 |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0200612 A1 | 8/2009 | Koldiaev |
| 2009/0239347 A1 | 9/2009 | Ting et al. |
| 2009/0321836 A1 | 12/2009 | Wei et al. |
| 2010/0155790 A1 | 6/2010 | Lin et al. |
| 2010/0163926 A1 | 7/2010 | Hudait et al. |
| 2010/0187613 A1 | 7/2010 | Colombo et al. |
| 2010/0207211 A1 | 8/2010 | Sasaki et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2012/0086053 A1 | 4/2012 | Tseng et al. |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| WO | WO2007/115585 | 10/2007 |

OTHER PUBLICATIONS

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

Shikida, Mitsuhiro, et al., "Comparison of Anisotropic Etching Properties Between KOH and TMAH Solutions", IEEE Xplore, Jun. 30, 2010, pp. 315-320.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Quirk et al., Semiconductor Manufacturing Technology, Oct. 2001, Prentice Hall, Chapter 16.

McVittie, James P., et al., "SPEDDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

* cited by examiner

MEMORY POWER GATING CIRCUIT FOR CONTROLLING INTERNAL VOLTAGE OF A MEMORY ARRAY, SYSTEM AND METHOD FOR CONTROLLING THE SAME

CROSS-REFERENCE TO RELATED APPLICATIONS

The present application claims priority of U.S. Application Ser. No. 61/154,744, filed on Feb. 23, 2009, which is incorporated herein by reference in its entirety.

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

BACKGROUND

The present disclosure relates generally to the field of semiconductor devices, and more particularly, to apparatus and methods for controlling the power requirements of memories.

The semiconductor integrated circuit (IC) industry has experienced rapid growth. Technological advances in IC materials and design have produced generations of ICs where each generation has smaller and more complex circuits than the previous generation. The scaling of IC techniques to the nanometer regime has increased power dissipation. The increased power dissipation causes several problems including reducing battery life in mobile systems, expensive packaging and cooling solutions and can also result in chip failures. Of the various factors contributing to power dissipation, power dissipation due to leakage or static power dissipation is rising and is predicted to exceed dynamic power dissipation in the near future.

Passive power gating has helped to reduce the power dissipation in memories. A conventional power gating circuit consists of a header driver coupled to a header consisting of multiple transistors. During an active mode, the header driver turns on the transistors of the header to provide driving currents to a memory. During a deep sleep mode, the header driver turns off the transistors of the header. During a data retention mode, the transistors of the header function as diodes and the header driver controls the transistors to maintain a lower internal supply voltage level.

SUMMARY

In at least one embodiment, a memory array having an internal voltage is coupled to a power gating circuit. The power gating circuit maintains the internal voltage between a first threshold voltage and a second threshold voltage by raising the internal voltage if the internal voltage is lower than the first threshold voltage, and lowering the internal voltage if the internal voltage is higher than the second threshold voltage.

In at least one embodiment, a method of retaining data of a memory array having an internal voltage includes detecting the internal voltage of the memory array, and raising the internal voltage if the internal voltage is lower than a first threshold voltage, and lowering the internal voltage if the internal voltage is higher than a second threshold voltage, different than the first voltage, thereby maintaining the internal voltage between the first threshold voltage and the second threshold voltage.

These and other embodiments, as well as its features, are described in more detail in conjunction with the text below and attached figures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
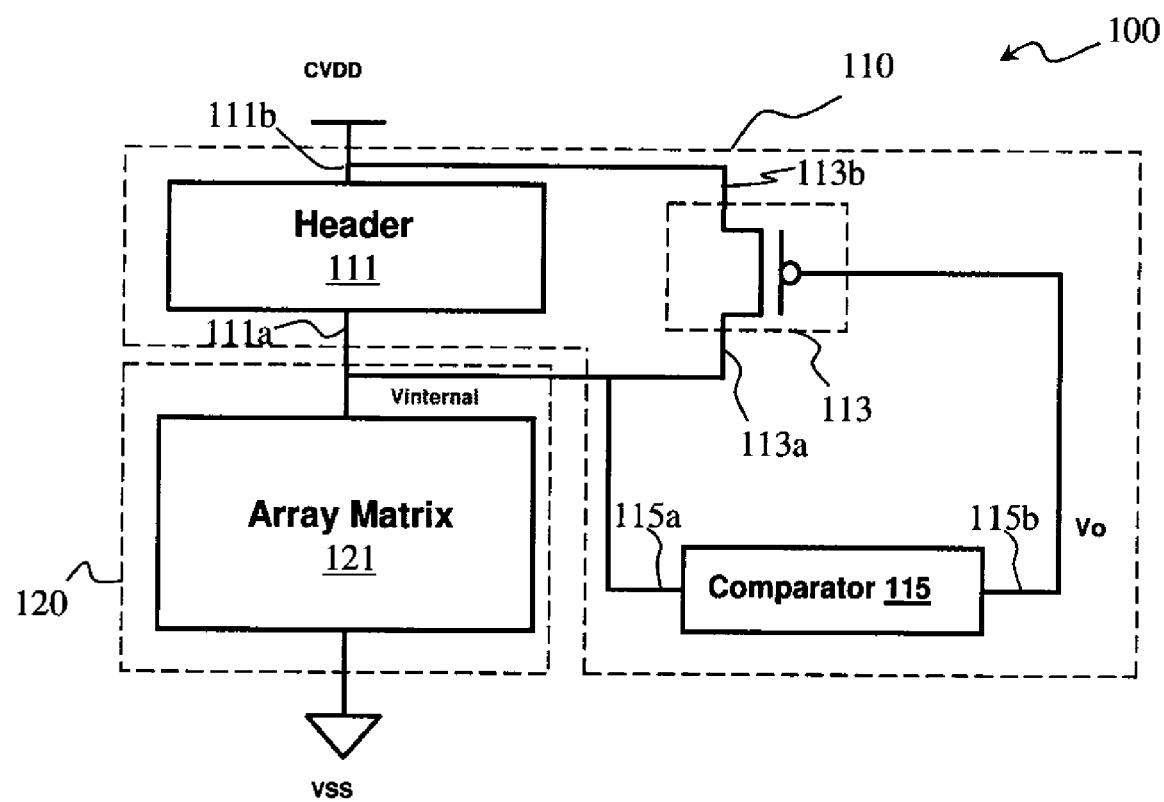
FIG. 1 is a schematic drawing showing an exemplary power gating circuit coupled with a memory array.

During the data retention mode of a memory array, the transistors of the header function as diodes. Diode currents of the transistors are small and therefore, a large number of transistors in the header are used to provide the diode currents required to retain the data information of the memory. However, the large number of transistors requires a large area that increases the size of the memory. It is also known that conventional power gating circuit is vulnerable to Process-Voltage-Temperature (PVT) variations.

An active-bias method has also been proposed to reduce power dissipation of memories. The active-bias method uses an operational amplifier to constantly monitor and adjust the voltage level of the memory. However, operational amplifiers require a large amount of memory area and are not compatible with embedded memories, such as embedded Static Random Access Memory (SRAM).

It is understood that the following disclosure provides many different embodiments, or examples, for implementing different features thereof. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments relate to power gating circuits and operational methods of integrated circuits such as drivers, memories, other circuits including memory arrays, and/or combinations thereof. The power gating circuits can provide a hysteresis loop to a memory for retaining an internal voltage of the memory between two threshold voltages during the data retention mode.

FIG. 1 is a schematic drawing showing an exemplary power gating circuit coupled with a memory array. In FIG. 1, a system 100 includes a power gating circuit 110 coupled with a memory array 120. In some embodiments, the system 100 is a memory (e.g., DRAM, SRAM, Embedded-DRAM, and/or Embedded SRAM), a driver, other integrated circuits, and/or combinations thereof. In some embodiments, the memory array 120 is coupled with an external power source, such as ground or VSS. The memory array 120 includes an array matrix 121 and has an internal voltage ($V_{internal}$) for providing voltages to the array matrix 121. In embodiments, the internal voltage ($V_{internal}$) is a virtual CVDD (memory-core supply voltage).

In embodiments, the power gating circuit 110 includes at least one first switch such as a header 111 having a first end 111a and a second end 111b. In some embodiments, first end 111a of the header 111 is coupled with the $V_{internal}$ of the memory array 120. The second end 111b of the header 111 is coupled with an external power voltage such as an external power source CVDD of the memory array 120 to provide power to the system 100. In embodiments, the header 111 includes a plurality of parallel transistors such as P-type metal-oxide-semiconductor FETs (PMOSFETs). The parallel transistors are coupled with and provide operating current to the memory array 120. During a data retention mode, the transistors of the header 111 serve as diodes.

In at least some embodiments, at least one second switch 113 is coupled with the header 111. A first end 113a of the second switch 113 is coupled with the first end 111a of the header 111. A second end 113b of the second end 113 is coupled with the second end 111b of the header 111. In embodiments, the switch 113 is a digital switch, analog switch, relay, other electronic switch, and/or combinations thereof. In other embodiments, the switch 113 includes at least one transistor such as a field effect transistor (FET). In embodiments, the switch 113 includes at least one PMOSFET. In still other embodiments, the switch 113 includes a PMOSFET coupled with an NMOSFET.

In some embodiments, a comparator circuit 115 is coupled with the switch 113. An input end 115a of the comparator circuit 115 is coupled with the first end 113a of the switch 113, and an output end 115b of the comparator circuit 115 is coupled with the switch 113. The comparator circuit 115 detects the $V_{internal}$ of the memory array 120 in order to generate an output signal. The comparator circuit 115 and the switch 113 are configured to provide a feedback loop to the $V_{internal}$ of the memory array 120. In embodiments, the switch 113 includes a PMOSFET.

Figure 2:
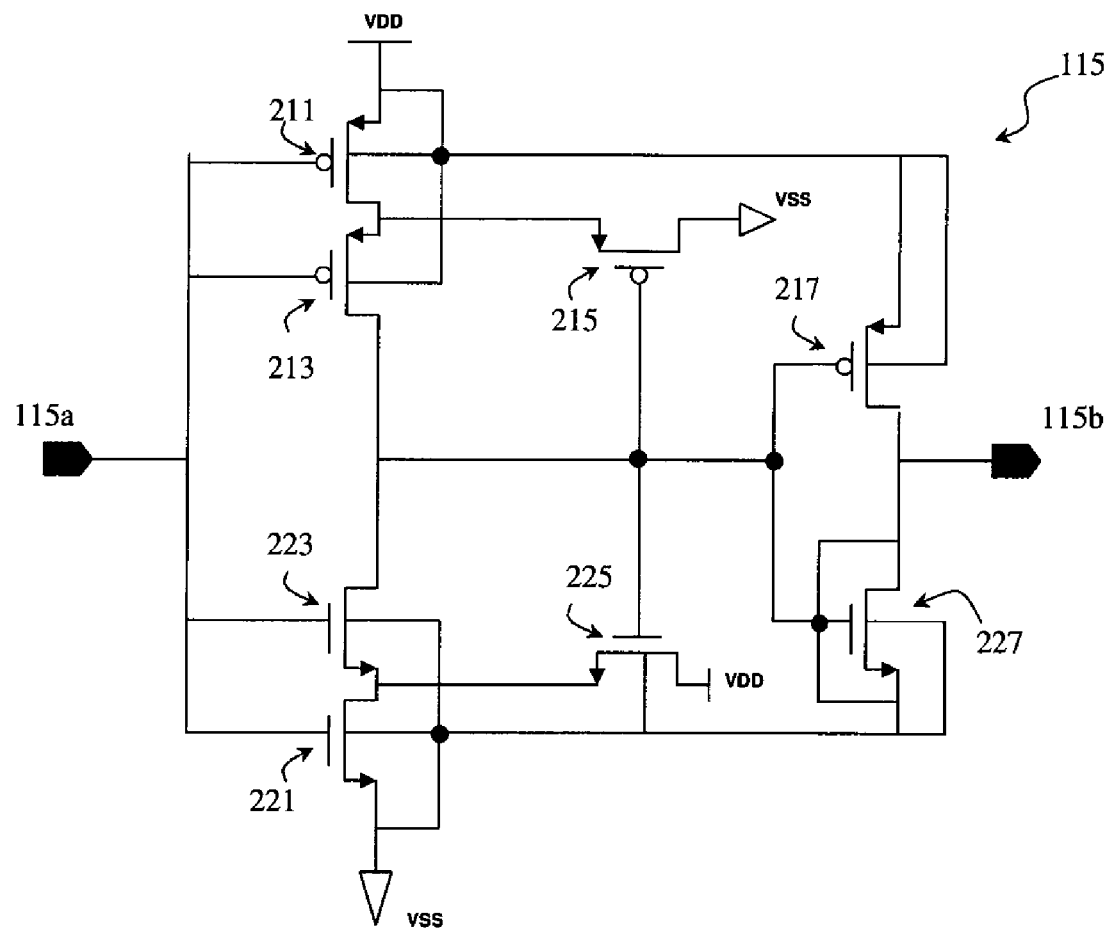
FIG. 2 is a schematic drawing illustrating an exemplary comparator circuit.

In embodiments, the comparator circuit 115 is a Schmitt trigger or other circuit that provides a positive feedback control for the switch 113. FIG. 2 is a schematic drawing of an exemplary comparator circuit. In FIG. 2, the comparator circuit 115 is a Schmitt trigger. The comparator circuit 115 includes the input end 115a coupled with the $V_{internal}$ of the memory array 120 (shown in FIG. 1) and the output end 115b coupled with the switch 113 (shown in FIG. 1). In embodiments, the comparator circuit 115 includes PMOSEFTs 211, 213, 215, and 217 and NMOSFETs 221, 223, 225, and 227. It is noted that the number of the transistors and configuration of the comparator 115 are merely exemplary. Based on the embodiments, one of ordinary skill in the art will be able to modify the comparator circuit 115 and/or to use other circuits to provide a digital feedback control for the switch 113.

Following are descriptions regarding maintaining the $V_{internal}$ of the memory array 120 during the memory retention mode. To retain data of the memory array 120, the power gating circuit 110 provides a hysteresis function to raise the $V_{internal}$ of the memory array 120 if the $V_{internal}$ is lower than a first threshold voltage, and to lower the $V_{internal}$ of the memory array 120 if the $V_{internal}$ is higher than a second threshold voltage. The power gating circuit 110 retains the $V_{internal}$ of the memory array 120 between the first threshold voltage and the second threshold voltage.

Figure 3:
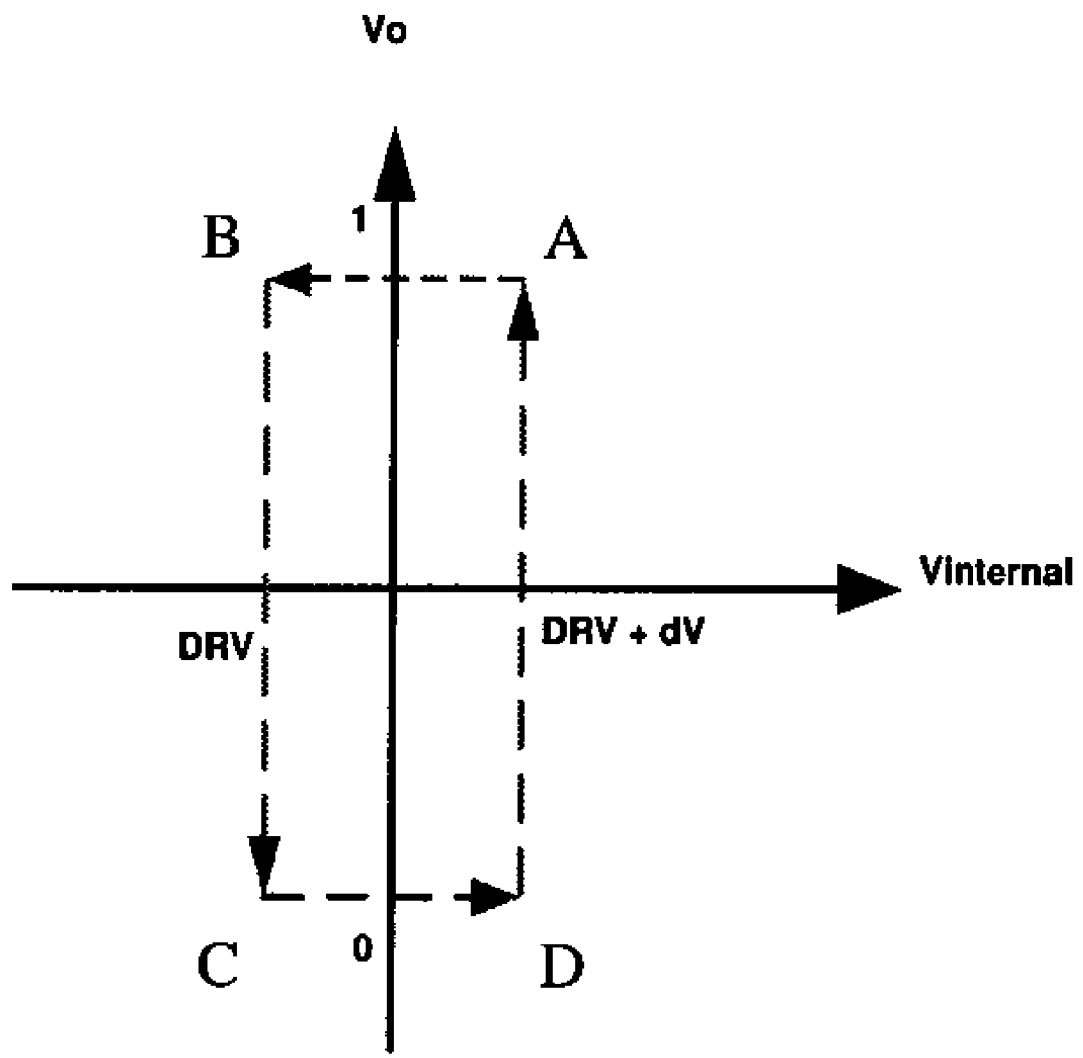
FIG. 3 is a schematic drawing showing a hysteresis relationship between output signals of the comparator circuit and the $V_{internal}$ of the memory array.

FIG. 3 is a schematic drawing of a hysteresis relationship between output signals of the comparator circuit and the $V_{internal}$ of the memory array. Referring to FIGS. 1 and 3, the input end 115a of the comparator circuit 115 monitors the $V_{internal}$ of the memory array 120. During the transition of the system 100 from "A" to "B" (shown in FIG. 3), the comparator circuit 115 generates an output signal "1" at the output end 115$b$. The output signal "1" turns off the switch 113. At "B," if V$_{internal}$ is determined to be lower than the first threshold voltage, such as a data retention voltage (DRV) of a memory cell of the array matrix 121, the comparator circuit 115 outputs a signal "0" at the output end 115$b$, thereby turning on the switch 113, providing a desired amount of current from the CVDD that raises the V$_{internal}$ of the memory array 120 and transitions the system 100 from "B" to "C." If the system 100 transitions from "C" to "D," the comparator circuit 115 maintains output signal "0" to turn on the switch 113. At the status "D" if the V$_{internal}$ of the memory array 120 is higher than the second threshold voltage, e.g., DRV+ΔV, the comparator circuit 115 outputs a signal "1" that turns off the switch 113, changing the status of the system 100 from "D" to "A." The ΔV is an amount of voltage difference from the DRV and is any suitable value. One of skill in the art can use different ΔVs to achieve different results.

It is noted that during the data retention mode the PMOS-FET of the switch 113 provides a current of about at least one order of magnitude higher than that generated by the transistors of the header 111. The PMOSFET of the switch 113 is configured to vary the V$_{internal}$ of the memory array 120 more than the transistors of header 111. By using the PMOSEFT of the switch 113, the number of the transistors of the header 111 needed to retain the status of the V$_{internal}$ and the area of the header 111 is reduced, too. For example, a conventional 32M memory has a conventional header coupled with a 32M memory array. The conventional header has 32,768 transistors for providing operating current and maintaining the status of the internal voltage of the 32M memory array. In one embodiment, the system 100 disclosed above includes power gating circuit 110 and a memory array 120 of 32M. The power gating circuit 110 includes header 111 that further includes 16,384 transistors and switch 113 that includes 4 PMOS-FETs. Accordingly, the number of transistors in header 111 is one half of the conventional header, and the area of header 111 is about a one half of the conventional header. Additionally, the system 100 operates within design specifications even under worst Process-Voltage-Temperature (PVT) variations, such as at FF/SS/0.9V/–40° C.

Figure 4:
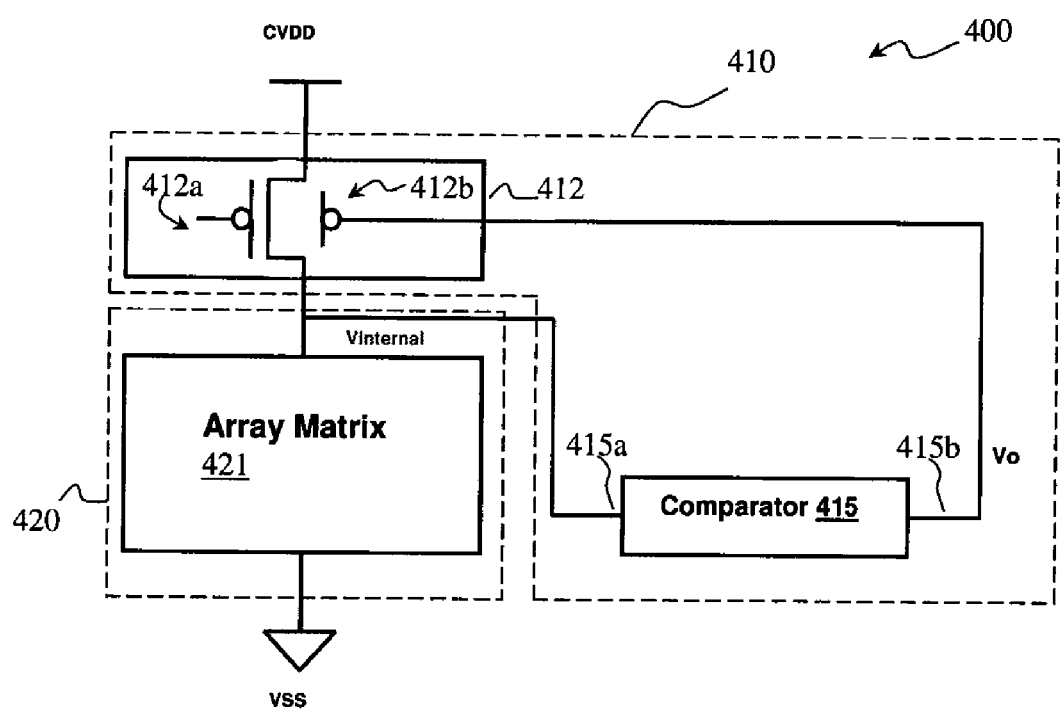
FIG. 4 is a schematic drawing showing another exemplary memory including a power gating circuit having a fin-based multigate transistor (FinFET).

FIG. 4 is a schematic drawing showing another exemplary memory device that includes a power gating circuit having a FinFET. In FIG. 4, a system 400 includes a power gating circuit 410 coupled with a memory array 420. The memory array 420 includes an array matrix 421 and has an internal voltage V$_{internal}$. Elements of FIG. 4 that are the same as in FIG. 1 are indicated by the same reference numerals, increased by 300.

The power gating circuit 410 includes at least one switch such as a header 412 coupled with a comparator circuit 415. The comparator circuit 415 has an input end 415$a$ coupled with the internal voltage V$_{internal}$ of the memory array 420 and an output end 415$b$ coupled with the header 412. The input end 415$a$ monitors the internal voltage V$_{internal}$ of the memory array 420, and the output end 415$b$ transmits output signals to the header 412 to control the header.

In embodiments, the header 412 includes a FinFET having a front gate 412$a$ and a back gate 412$b$. The front gate 412$a$ receives a control signal, such as a data retention signal, from a driver. The back gate 412$b$ is coupled with the output end 415$b$ of the comparator circuit 415 and controls a current flow at least one order larger than that controlled by the front gate 412$a$, such that the current flow controlled by the back gate 412$b$ can raise or lower the V$_{internal}$ of the memory array 420.

The following disclosure describes one embodiment of the apparatus and method of maintaining the V$_{internal}$ of the memory array 420 during a memory retention mode. To retain data of the memory array 420, the power gating circuit 410 provides a hysteresis function to raise the V$_{internal}$ of the memory array 420 if the V$_{internal}$ is lower than a first threshold voltage, and to lower the V$_{internal}$ of the memory array 420 if the V$_{internal}$ is higher than a second threshold voltage. The power gating circuit 410 retains the V$_{internal}$ of the memory array 420 between the first threshold voltage and the second threshold voltage.

Referring to FIGS. 3 and 4, the input end 415$a$ of the comparator circuit 415 detects the V$_{internal}$ of the memory array 420. Assuming that the operational status of the system 400 transitions from "A" to "B" (shown in FIG. 3), the comparator circuit 415 outputs a signal "1" at the output end 415$b$ during the period A to B. The output signal "1" is applied to the back gate 412$b$ of the header 412 to turn off a current path controlled by the back gate 412$b$. At status "B," if V$_{internal}$ is determined to be lower than the first threshold voltage, e.g., DRV, the comparator circuit 415 outputs a signal "0" at the output end 415$b$ to turn on the gate path controlled by the back gate 412$b$. The current path controlled by the back gate 412$b$ is configured to provide a desired amount of currents from CVDD and raise the V$_{internal}$ of the memory array 420. The status of the system 400 is changed from "B" to "C" (shown in FIG. 3). If the status of the operation of the system 400 is changed from "C" to "D," the comparator circuit 415 maintains the output signal "0" to turn on the back gate 415$b$. At status "D" if V$_{internal}$ of the memory array 420 is determined to be higher than the second threshold voltage, e.g., DRV+ΔV, the comparator circuit 415 outputs a signal "1" that turns off the back gate 412$b$, cutting off the current path. The status of the system 400 is changed from "D" to "A."

It is noted that the system 400 of FIG. 4 includes power gating circuit 410 using FinFETs to provide operating currents to the memory array 420. Compared with power gating circuit 110 of FIG. 1, the power gating circuit 410 does not include the switch 113, further reducing the area of the header 412. In other embodiments, the power gating circuit 410 includes a switch such as the switch 113 to achieve a desired feedback compensation or hysteresis function.

Figure 5:
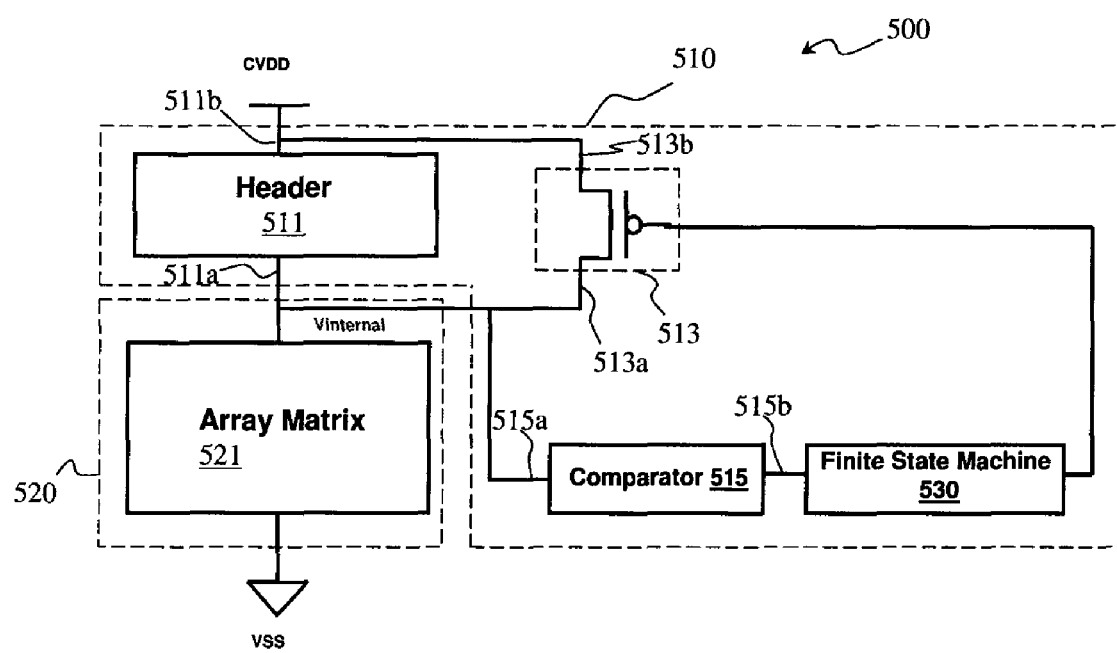
FIG. 5 is a schematic drawing illustrating a memory array coupled with an exemplary power gating circuit including a finite state machine.

FIG. 5 is a schematic drawing illustrating a memory array coupled with an exemplary power gating circuit including a finite state machine. Items of FIG. 5 that are the same items in FIG. 1 are indicated by the same reference numerals, increased by 400. In FIG. 5, the power gating circuit 510 includes a finite state machine 530 coupled between the comparator circuit 515 and the switch 513. The finite state machine 530 receives output signals from the comparator circuit 515 and then generates signals having multiple states, such as 4, 8, 16, or more. The multiple state output signals control the operation of the switch 513 to provide a feedback loop or hysteresis compensation. One of skill in the art would be able to choose the number of the states of the finite state machine 530 to achieve a desired hysteresis compensation for the system 400.

Figure 6:
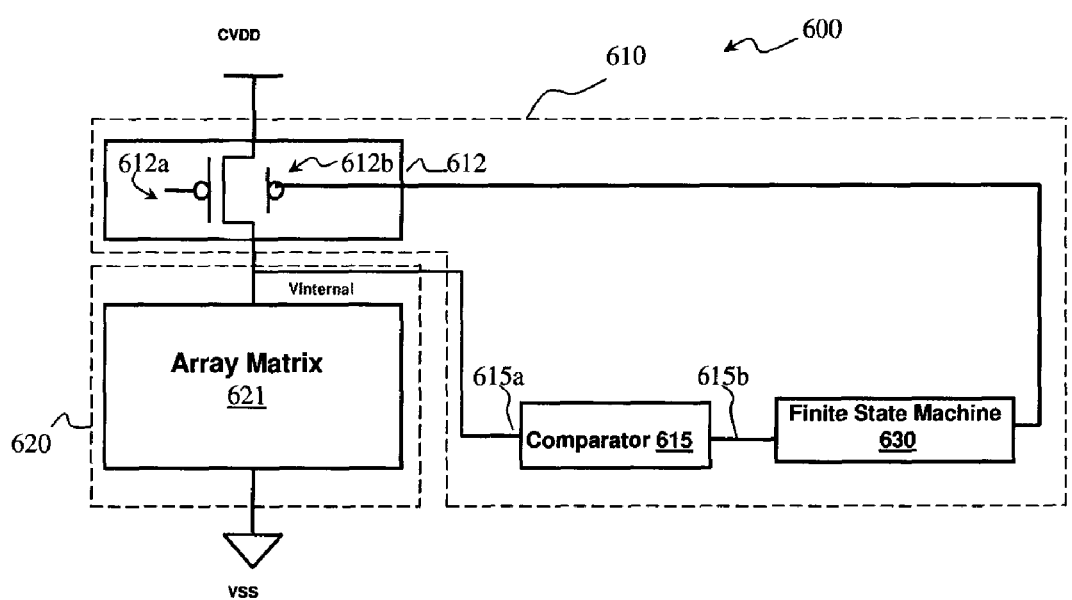
FIG. 6 is a schematic drawing illustrating a memory array coupled with another exemplary power gating circuit including a finite state machine.

FIG. 6 is a schematic drawing illustrating a memory array coupled with another exemplary power gating circuit including a finite state machine. Elements of FIG. 6 that are the same items in FIG. 4 are indicated by the same reference numerals, increased by 200. In FIG. 6, the finite state machine 630 is coupled between the back gate 612$b$ of the FinFET and the comparator circuit 615. The finite state machine 630 receives output signals from the comparator circuit 615 and then generates signals having multiple states, such as 4, 8, 16, or more. The multiple state output signals control the operation of the back gate of the FinFET to provide a feedback loop or hysteresis compensation. One of skill in the art would choose the number of the states of the finite state machine 630 to achieve a desired hysteresis compensation for the system 600.

Figure 7:
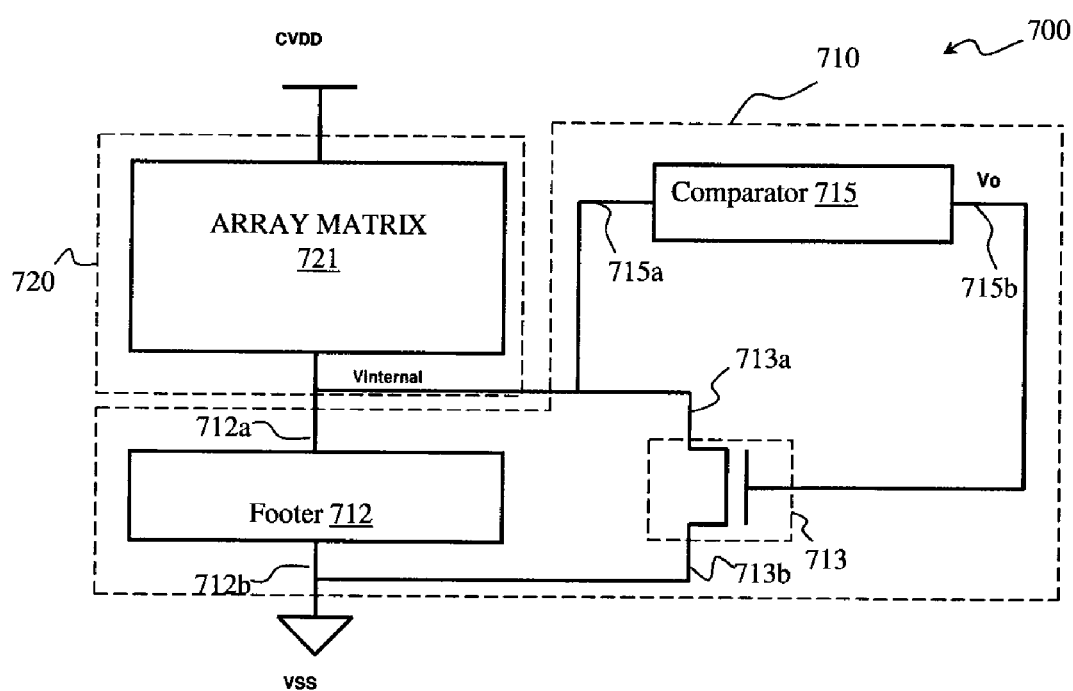
FIG. 7 is a schematic drawing showing an exemplary power gating circuit coupled with a memory array.

FIG. 7 is a schematic drawing of system 700 that includes an exemplary power gating circuit coupled with a memory array. Elements of FIG. 7 that are the same items in FIG. 1 are indicated by the same reference numerals, increased by 600. System 700 includes a power gating circuit 710 coupled with a memory array 720. In FIG. 7, the power gating circuit 710 includes at least one switch, such as a footer 712 having a first end 712a and a second end 712b. The first end 712a is coupled with a first end 713a of a switch 713 and the second end 712b is coupled with a second end of the switch 713. In the embodiment, switch 713 is an NMOSFET.

Figure 8:
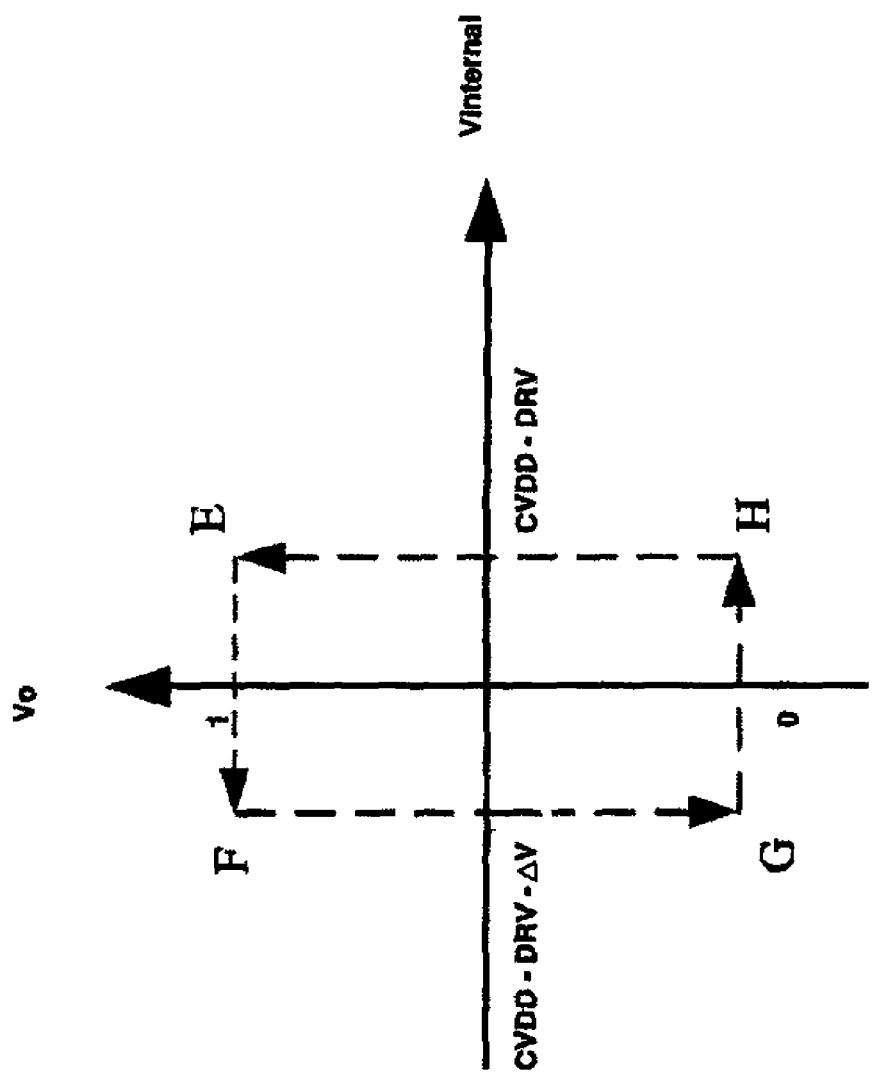
FIG. 8 is a schematic drawing showing a hysteresis relationship between output signals of the comparator circuit and the $V_{internal}$ of the memory array.

Following are descriptions of an exemplary operation of the system 700 during a data retention state. FIG. 8 is a schematic drawing showing a hysteresis relationship between output signals of the comparator circuit and the $V_{internal}$ of the memory array. Referring to FIGS. 7 and 8, the input end 715a of the comparator circuit 715 monitors the $V_{internal}$ of the memory array 720. In embodiments, the internal voltage ($V_{internal}$) is a virtual VSS (V_VSS). During the transition of the system 700 from "E" to "F," comparator circuit 715 generates an output signal "1" at the output end 715b, which turns on the switch 713. At status "F," if $V_{internal}$ is determined to be lower than the first threshold voltage, e.g., CVDD-DRV, the comparator circuit 715 outputs a signal "0" that turns off the switch 713 to hold or raise the $V_{internal}$ of the memory array 720. The status of the system 700 then changes from "F" to "G." If the status of the operation of the system 700 is changed from "G" to "H", the comparator circuit 715 maintains the output signal "0" to turn off the switch 713. At status "H," if $V_{internal}$ of the memory array 720 is higher than the second threshold voltage, e.g., CVDD-DRV, the comparator circuit 715 output a signal "1" that turns on the switch 713, changing the status of the system 700 from "H" to "E." In embodiments, the power gating circuit 710 includes the finite state machine 530 shown in FIG. 5. The finite state machine is coupled between the comparator circuit 715 and the switch 713 to generate multiple states to the switch 713 in order to provide feedback loop compensation.

Figure 9:
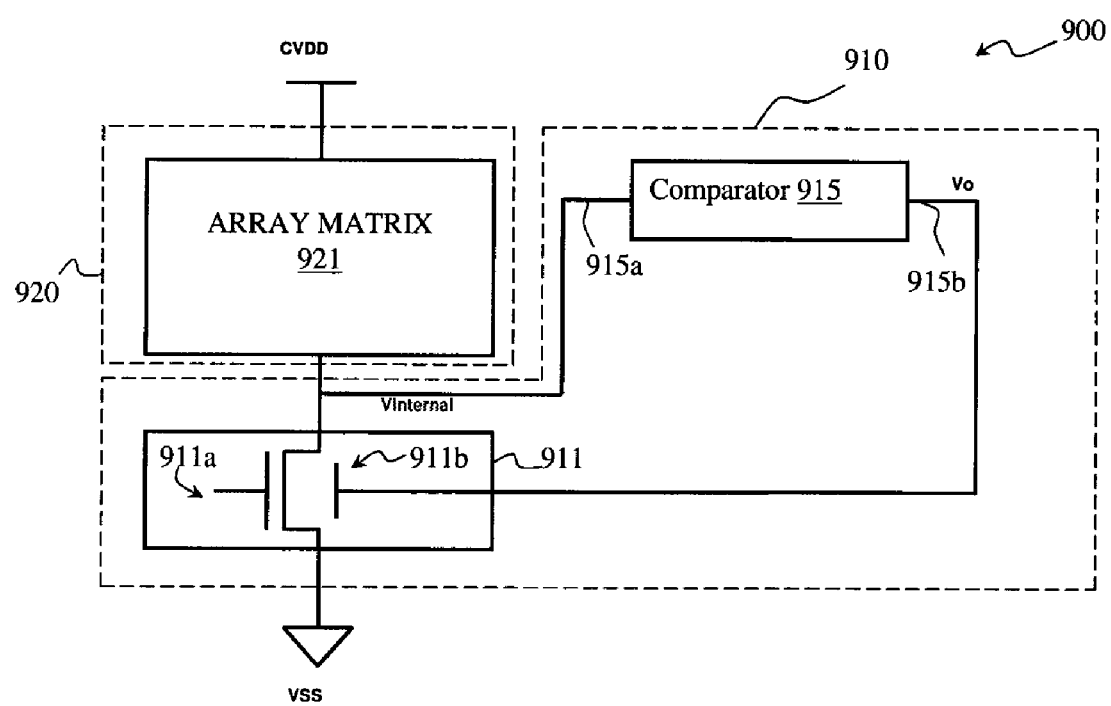
FIG. 9 is a schematic drawing showing another exemplary power gating circuit coupled with a memory array.

FIG. 9 is a schematic drawing showing another exemplary power gating circuit coupled with a memory array. Elements of FIG. 9 that are the same items in FIG. 4 are indicated by the same reference numerals, increased by 500. In FIG. 9, a system 900 includes a power gating circuit 910 coupled with a memory array 920. In embodiments, the power gating circuit 910 includes at least one switch, such as footer 911 coupled with a comparator circuit 415.

In embodiments, the footer 911 includes an N-type FinFET having a front gate 911a and a back gate 911b. The front gate 911a receives a signal, such as a data retention signal from a driver. The back gate 911b is coupled with the output end 915b of the comparator circuit 915 and controls a current flow at least one order larger than that controlled by the front gate 911a, such that the current flow controlled by the back gate 911b can raise or lower the $V_{internal}$ of the memory array 920.

Referring to FIGS. 8 and 9, the input end 915a of the comparator circuit 915 monitors the $V_{internal}$ of the memory array 920. When the status of the system 900 is changed from "E" to "F," the comparator circuit 915 generates an output signal "1" at the output end 915b during the period E-F that is applied to the back gate 911b of the header 911 to turn on a current path controlled by the back gate 412b. At the status "F" if $V_{internal}$ is determined to be lower than the first threshold voltage, such as VCDD-DRV-$\Delta$V, the comparator circuit 915 outputs a signal "0" at the output end 915b. The output signal "0" is applied to the back gate 911b to turn off the gate path controlled by the back gate 911b in order to raise the $V_{internal}$ of the memory array 920. The status of the system 900 is then changed from "F" to "G.". If the status of the status of the system 900 is changed from "G" to "H", the comparator circuit 915 maintains the output signal "0" in order to turn off the back gate 911b. At the status "H" if $V_{internal}$ of the memory array 920 is determined to be higher than the second threshold voltage such as CVDD-DVR, the comparator circuit 915 outputs a signal "1" that turn on the back gate 911b to lower the $V_{internal}$ of the memory array 920. The status of the system 900 then is changed from "H" to "E." In at least one embodiment, the power gating circuit 910 includes the finite state machine 630, as shown in FIG. 6. The finite state machine is coupled between the comparator circuit 715 and the back gate 713b of the switch 713 to generate multiple states to the switch 713 in order to provide feedback loop compensation.

It is noted that the power gating circuits and memories described above in conjunction with FIGS. 1-9 are formed within a system which can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power gating circuit configured to couple with a memory array having an internal voltage, the power gating circuit comprising:

circuitry having an output signal that raises the internal voltage of the memory array if the internal voltage is lower than a first threshold voltage, and lowers the internal voltage if the internal voltage is higher than a second threshold voltage, thereby retaining the internal voltage between the first threshold voltage and the second threshold voltage during a data retention mode.

2. The power gating circuit of claim 1, wherein the circuitry provides a hysteresis function.

3. The power gating circuit of claim 1, wherein the circuitry comprises:

at least one first switch, a first end of the at least one first switch is coupled with the internal voltage, and a second end of the at least one first switch coupled with an external power voltage;

a second switch, a first end of the second switch is coupled with the first end of the at least one first switch, and a second end of the second switch is coupled with the second end of the at least one first switch; and a comparator circuit, an input end of the comparator circuit coupled with the first end of the second switch and an output end of the comparator circuit coupled with the second switch, wherein the second switch and the comparator circuit are configured to provide a feedback loop to the internal voltage.

4. The power gating circuit of claim 3, wherein the at least one first switch is a header including at least one P-type metal-oxide-semiconductor (PMOS) transistor and the external power voltage is an external power supply voltage.

5. The power gating circuit of claim 3, wherein the at least one first switch is a footer including at least one N-type metal-oxide-semiconductor (NMOS) transistor and the external power voltage is a ground voltage.

6. The power gating circuit of claim 3, wherein the second switch comprises at least one field effect transistor configured to adjust the internal voltage to retain data information of the memory array.

7. The power gating circuit of claim 3, wherein the comparator circuit comprises a Schmitt trigger configured to detect the internal voltage to generate an output signal for controlling the second switch.

8. The power gating circuit of claim 3 further comprising a finite state machine coupled between the comparator circuit and the second switch.

9. The power gating circuit of claim 1, further comprising:
at least one first switch including a Fin field effect transistor (FinFET), a first end of the first switch coupled with the internal voltage and a second end of the first switch coupled with an external power voltage, wherein the FinFET comprises a front gate and a back gate and the front gate is capable of receiving a data retention signal; and
a comparator circuit, an input end of the comparator circuit coupled with the internal voltage and an output end of the comparator circuit coupled with the back gate of the FinFET to adjust the internal voltage, wherein the FinFET and the comparator circuit are configured to provide a feedback loop to the internal voltage.

10. The power gating circuit of claim 9, wherein the first switch is a header including at least one P-type FinFET and the external power voltage is an external power supply voltage.

11. The power gating circuit of claim 9, wherein the first switch is a footer including at least one N-type FinFET and the external power voltage is a ground voltage.

12. The power gating circuit of claim 9 further comprising a finite machine between the comparator circuit and the back gate of the FinFET.

13. A system comprising:
a memory array having an internal voltage; and
a power gating circuit coupled with the memory array, wherein the power gating circuit is configured to raise the internal voltage if the internal voltage is lower than a first threshold voltage, and to lower the internal voltage if the internal voltage is higher than a second threshold voltage in order to retain the internal voltage between the first threshold voltage and the second threshold voltage during a data retention mode.

14. The system of claim 13, wherein the function is a hysteresis function.

15. The system of claim 13, wherein the power gating circuit comprises:
at least one first switch, a first end of the at least one first switch coupled with the internal voltage and a second end of the at least one first switch coupled with an external power voltage;
a second switch, a first end of the second switch coupled with the first end of the at least one first switch and a second end of the second switch coupled with the second end of the at least one first switch; and
a comparator circuit, an input end of the comparator circuit coupled with the first end of the second switch and an output end of the comparator circuit coupled with the second switch, wherein the second switch and the comparator circuit are configured to provide a feedback loop to the internal voltage.

16. The system of claim 15, wherein the second switch comprises at least one field effect transistor configured to adjust the internal voltage to retain data information of the memory array.

17. The system of claim 15, wherein the comparator circuit comprises a Schmitt trigger configured to detect the internal voltage to generate an output signal for controlling the second switch.

18. The system of claim 15 further comprising a finite state machine coupled between the comparator circuit and the second switch.

19. The system of claim 13, wherein the power gating circuit comprises:
at least one first switch including a Fin field effect transistor (FinFET), a first end of the first switch coupled with the internal voltage and a second end of the first switch coupled with an external power voltage, wherein the FinFET comprises a front gate and a back gate and the front gate is capable of receiving a data retention signal; and
a comparator circuit, an input end of the comparator circuit coupled with the internal voltage and an output end of the comparator circuit coupled with the back gate of the FinFET to adjust the internal voltage, wherein the FinFET and the comparator circuit are configured to provide a feedback loop to the internal voltage.

20. The system of claim 19 further comprising a finite machine between the comparator circuit and the back gate of the FinFET.

21. A method for retaining data of a memory array having an internal voltage, the method comprising:
detecting the internal voltage of the memory array; and
providing a function based on the detected internal voltage that raises the internal voltage if the internal voltage is lower than a first threshold voltage, and lowers the internal voltage if the internal voltage is higher than a second threshold voltage, in order to retain the internal voltage between the first threshold voltage and the second threshold voltage during a data retention mode, wherein the first and second threshold voltages are different.

22. The method of claim 21, wherein the function is a hysteresis function.

23. The method of claim 21, wherein the function to raise or lower the internal voltage of the memory array comprises turning on or off a current path between the internal voltage and an external power supply, wherein the current path is capable of providing a current at least one order higher than that of a transistor of a header or footer coupled with the memory array.

24. The method of claim 21 further comprising outputting at least four states to provide the function based on the detected the internal voltage.

* * * * *